United States Patent
Cecere et al.

[11] Patent Number: 5,840,630
[45] Date of Patent: Nov. 24, 1998

[54] FBI ETCHING ENHANCED WITH 1,2 DI-IODO-ETHANE

[75] Inventors: Michael A. Cecere, San Jose; Theodore Ralph Lundquist, Dublin, both of Calif.

[73] Assignee: Schlumberger Technologies Inc., San Jose, Calif.

[21] Appl. No.: 771,804

[22] Filed: Dec. 20, 1996

[51] Int. Cl.[6] .................................................. H01L 21/302
[52] U.S. Cl. ........................... 438/712; 438/718; 438/720
[58] Field of Search ..................................... 438/712, 710, 438/718, 720

[56] References Cited

U.S. PATENT DOCUMENTS

| | | | |
|---|---|---|---|
| 4,226,666 | 10/1980 | Winters et al. | 156/643 |
| 5,009,743 | 4/1991 | Swann | 156/643 |
| 5,104,164 | 4/1992 | Talbot et al. | 250/492.2 |
| 5,188,705 | 2/1993 | Swanson et al. | 156/643 |
| 5,376,791 | 12/1994 | Swanson et al. | 250/309 |

OTHER PUBLICATIONS

"Dry Etching of III–V Semiconductors in $CH_3I$, $C_2H_5I$, and $C_3H_7I$ Discharges"; Chakrabarti et al.; J. Voc. Sci, and Tech, B; vol. 10, No. 6, pp. 2378–2386; Dec. 1992.

"Low Temperature Chemically Assisted Ion–Beam Etching Processes Using Cl/2, $CH_3I$, and $IBr_3$ to etch InP Optoelectronic Devices"; J. Voc. Sci. Tech., B (Jun. 1996'), pp. 1780–1783; Eisele et al.; 14(3).

Materials Safety Data Sheet, Epigrade® EDI10 Source for Etching, NovaMOS Division, Advanced Technology Materials, Inc., dated Mar. 27, 1996, four pages.

Primary Examiner—Robert Kunemund
Assistant Examiner—George Goudreau
Attorney, Agent, or Firm—Bruce D. Riter; Danita J. M. Maseles

[57] ABSTRACT

A focused ion beam is used to etch material from a specimen while directing a vapor of 1,2 di-iodo-ethane at the surface being etched. The etch rate is accelerated for surfaces of aluminum and gold relative to the etch rate without use of 1,2 di-iodo-ethane.

16 Claims, 4 Drawing Sheets

FBI ETCHING ENHANCED WITH 1,2 DI-IODO-ETHANE

BACKGROUND OF THE INVENTION

1. Field of the Invention

The present invention relates to methods and apparatus for etching of materials using a focused ion beam (FIB), particularly employing 1,2 di-iodo-ethane to accelerate the etching rate of certain materials.

2. The Prior Art

Systems for the modification of integrated circuits and the like with a focused-ion-beam (FIB) are known. FIB systems having an injector tube and gas source for injecting gas at a surface region of an integrated circuit (IC) where the FIB is directed are also known. See, for example, U.S. Pat. No. 5,140,164, the content of which is incorporated herein by this reference. A FIB system commercially available as the "IDS P2X" system from Schlumberger Technologies, Inc., San Jose, Calif., has a gas manifold with a plurality of controllable inlet valves and a positionable outlet needle for selectively injecting gases from any of a plurality of gas sources toward an IC surface region to be treated with the FIB.

FIG. 1 shows a more detailed schematic diagram of such a FIB system 100. A vacuum chamber 102 evacuated by pumps 104 encloses a FIB column 106, a specimen stage 108 for holding a specimen 110 such as an IC device to be repaired, a detector 112, and a gas injector 114. Column 106 includes an ion source 116, and ion-optical elements 118 for controlling alignment and deflection of an ion beam 120. Detector 112 may comprise a scintillator 122 and a photo-multiplier tube 124 for detecting secondary electrons 126 emitted when ion beam 120 impinges on specimen 110.

The system includes a workstation 130 having a processor unit (CPU) 134, a monitor 136 and input/output (I/O) devices 138 such as a keyboard and/or mouse. Workstation 130 is linked by a bus 140 to a system control unit 142 comprising a control CPU, an image processor and image memory. System control unit 142 communicates via a bus 144 with a vacuum-pumps control 146 for controlling vacuum pumps 104, with gas injector control 148 for controlling gas injector 114, with FIB high-voltage control 150 for controlling ion source 116, with FIB alignment & deflection control 152 for controlling ion optical elements 118, with imaging electronics 154 which receive a detector signal from detector 112, and with specimen-stage control 156 for controlling specimen stage 108 to position specimen 110. System control unit 142 preferably receives image information from imaging electronics 154 and supplies beam control information to FIB alignment and deflection control 152.

In operation, a specimen 110 is placed in vacuum chamber 102. Chamber 102 is evacuated. Under control of system control unit 142, FIB 120 is scanned over a selected region of the specimen to mill away material from the surface of specimen 110 and/or to deposit material on the surface of specimen 110. During milling and deposition, a suitable gas is injected at the surface of specimen 110 from gas injector 114. In the Schlumberger IDS P2X system, for example, separate crucibles are provided for storage of multiple gas-producing compounds. The crucibles supply gas to an injector needle via a controllable manifold (not illustrated) so that rapid switch-over from one gas to another is possible upon command from the system control unit.

FIG. 2 shows a schematic view of prior-art apparatus for localized injection of a chemical at the surface area of a sample being etched with a FIB. A crucible 200 containing a quantity of the chemical is provided with a temperature-control element such as a heater 205. A valve 210 is controllable to allow passage of the chemical from crucible 200 via a tube 215, through vacuum-chamber wall 220 to an injection needle 225. Tube 215 and needle 225 are provided with temperature-control elements such as heaters 230 and 235. Chemical 240 is directed at the surface of a sample 245 in a region being worked by an ion beam 250.

Various techniques have been developed for using such systems to effect semiconductor IC device-level repair and diagnosis. For example, the FIB can be used to mill away (etch) material. The rate and controllability of milling can be enhanced by injecting gases which preferentially mill particular materials, such as dielectric or metal. Such techniques can be used to selectively expose IC structure for probing or examination, cut holes through power and ground planes, and to selectively sever conductors. Techniques are also known for injecting a gas in the presence of the FIB at the IC surface to selectively deposit conductive or insulating material. The conductor deposition techniques can be used to construct or reconstruct conductors, and to deposit pads used for mechanical or electron-beam probing.

It is known in the art to use chemicals in conjunction with ion-beam sputtering (etching) of materials to enhance the material removal rate. For example, U.S. Pat. Nos. 5,188,705 and 5,376,791 to Swanson et al disclose the use of a focused ion beam for sputtering (etching) of semiconductor devices while directing iodine vapor toward the surface to enhance the removal of materials such as silicon and aluminum. See also U.S. Pat. No. 5,009,743 to Swann, which describes the use of dual ion guns in combination with injection of molecular iodine, and U.S. Pat. No. 4,226,666 to Winters et al. which describes etching employing electron-beam or ion-beam radiation and a noble gas halide such as $XeF_2$, $XeF_4$, $XeF_6$, $KrF_2$, $KrF_4$ and $KrF_6$.

The use of $XeF_2$ with a FIB for preferential etching of dielectric in semiconductor devices has become commonplace—that is, the use of $XeF_2$ substantially increases the etching rate of dielectric relative to the etching rate of most metals so that conductors can be exposed rapidly and with less risk of electrostatic discharge damage.

The use of iodine vapor to enhance etching allows for preferential etching of metal relative to dielectric, such as for accelerated etching of aluminum interconnects in integrated circuits. However, iodine has a number of disadvantages. First, iodine is classified as a hazardous material, which makes shipping complicated. For example, a special license is required to ship iodine into Japan and, even with a license, delays are encountered in passing iodine through customs. Second, iodine is hygroscopic and mobile across surfaces, but is not easily desorbed. This leads to problems when performing chemical processes and in EDS analysis. Third, iodine causes a variety of problems in the delivery system. It tends to settle in valve seats, resulting in valve failure, and frequently clogs delivery tubulation.

Improved techniques for FIB etching of materials are needed, preferably techniques which can be implemented in Ga-ion-beam systems now used for milling and deposition of material in IC repair. An etch enhancer having the favorable properties of iodine but which avoids the disadvantages of iodine is needed.

SUMMARY OF THE INVENTION

Preferred embodiments of the invention offer methods and apparatus for enhanced etching of materials with a focused-ion beam in conjunction with 1,2 di-iodo-ethane. Enhanced etching in accordance with the invention is useful in diagnosis and repair of semiconductor IC devices with a charged-particle beam such as a FIB, particularly in facilitating certain types of repair and minimizing repair time. For example, a FIB system is operated in accordance with the invention to rapidly and preferentially etch a conductor of an IC, while minimizing damage to surrounding dielectric structure.

A method of etching material from a specimen in accordance with the invention comprises placing a specimen in a vacuum chamber, directing a vapor containing molecules of 1,2 di-iodo-ethane at a localized surface region of the specimen from which material is to be etched, generating a focused ion beam; and directing the focused ion beam at the localized surface region to etch material from the specimen. The specimen may be an integrated circuit. The material to be etched may, for example, be aluminum or gold. The focused ion beam may be scanned over the localized surface region at an average beam-current density of about 1 $pA/\mu m^2$ to about 60 $pA/\mu m^2$, preferably of about 5 $pA/\mu m^2$ to about 10 $pA/\mu m^2$. The vacuum chamber may have a background chamber pressure prior to introduction of 1,2 di-iodo-ethane of less than about $1.5\times10^{-5}$ Torr, preferably of less than about $1.0\times10^{-5}$ Torr. The vacuum chamber may have a total chamber pressure during introduction of 1,2 di-iodo-ethane of less than about $6\times10^{-5}$ Torr, preferably of between about $4\times10^{-5}$ Torr and about $5\times10^{-5}$ Torr. Directing a vapor containing molecules of 1,2 di-iodo-ethane at a localized surface region of the specimen from which material is to be etched may comprise maintaining a quantity of 1,2 di-iodo-ethane in a crucible at a temperature of about 30°–38° Celcius, preferably about 32°–35° Celcius, and allowing vapor of 1,2, di-iodo-ethane to pass along a pathway from the crucible through an injection orifice toward the localized surface region. The pathway is preferably maintained at a temperature of about 60° Celcius. The ions may have an energy in the range of 5 kev to 40 kev. The focused ion beam may be generated from a liquid metal ion source of Gallium ions.

These and other features of the invention will become apparent to those of skill in the art from the following description and the accompanying drawing figures.

DETAILED DESCRIPTION

The compound 1,2 di-iodo-ethane, $ICH_2CH_2I$ (CAS # 624-73-7), is commercially available from the Bulk Chemical Division of Aldrich Chemical Co., Inc., Milwaukee, Wis., USA, at a purity $\geq 99\%$. The high purity of the 1,2 di-iodo-ethane is not believed to be significant for accelerating focused-ion-beam etching of materials in accordance with the invention, though high purity is preferred for use in modification of semiconductor integrated circuits.

Figure 1:
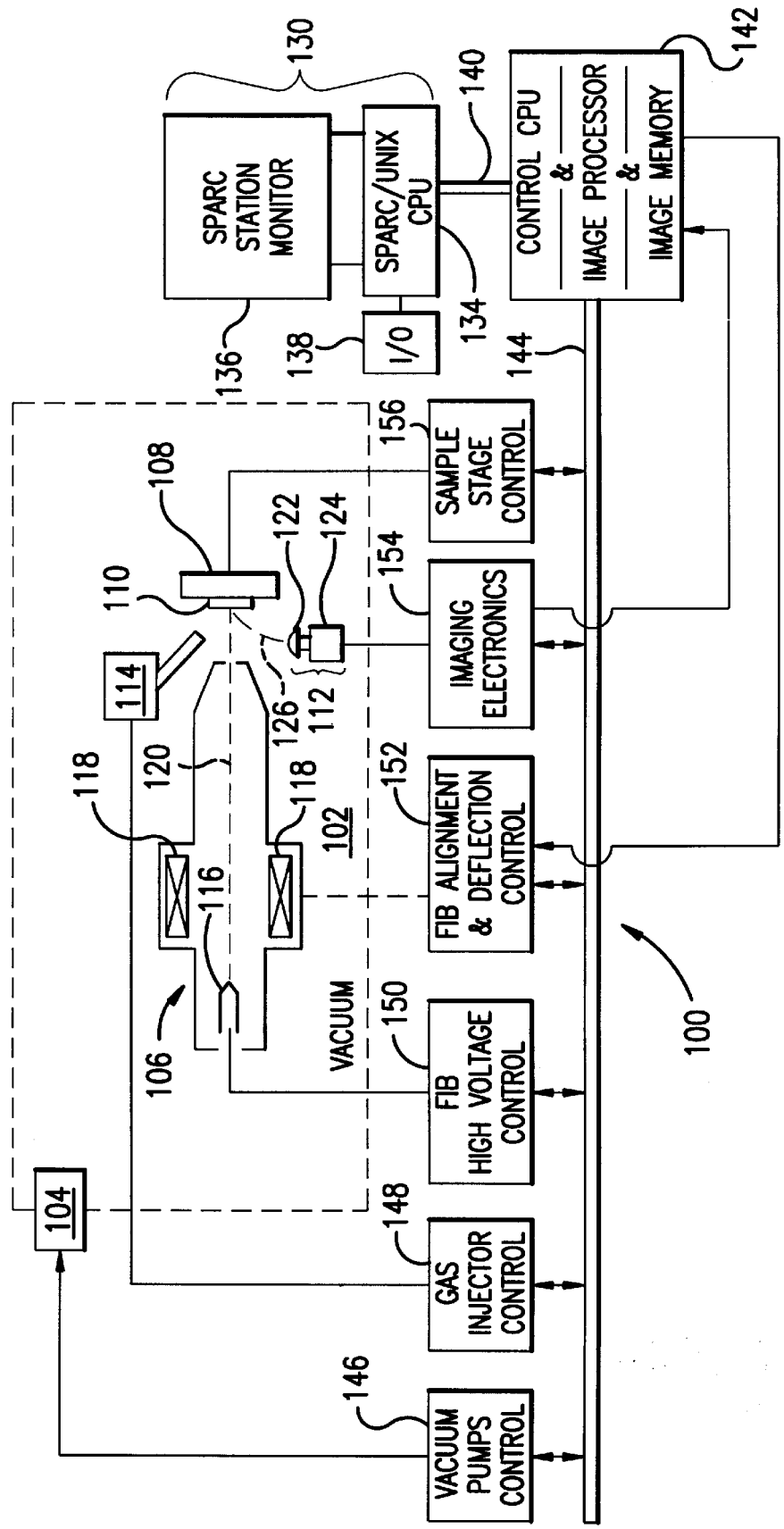
FIG. 1 shows a schematic diagram of a prior-art FIB system.
Figure 2:
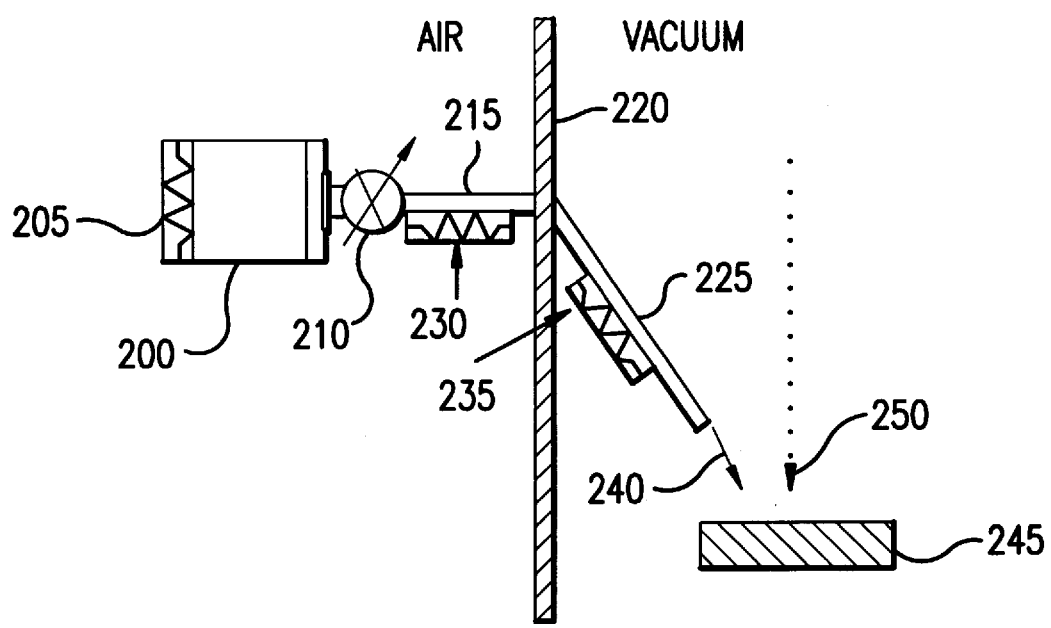
FIG. 2 shows a schematic view of prior-art apparatus for localized injection of a chemical at the surface area of a sample being etched with a FIB.

In a preferred embodiment, the 1,2 di-iodo-ethane compound is loaded into a small crucible of a FIB system, such as shown at 200 in FIG. 2. The vapor pressure of the 1,2 di-iodo-ethane at room temperature is too low to deliver the 1,2 di-iodo-ethane to the sample. The crucible and delivery path, such as tube 215 and needle 225 of FIG. 2, are therefore heated to assure sufficient vapor pressure to assure delivery of the 1,2 di-iodo-ethane effluent to the surface of the sample being worked.

Ambient background chamber pressure is monitored prior to introduction of 1,2 di-iodo-ethane. Total chamber pressure is monitored during introduction of 1,2 di-iodo-ethane. The difference between these values is taken to be the partial pressure of 1,2 di-iodo-ethane in the chamber. A gas flow rate of 1,2 di-iodo-ethane can be calculated from the partial pressure and orifice are of the injection needle. For example, a 1,2 di-iodo-ethane partial pressure of $\sim 4\times10^{-5}$ results from a gas flow rate into the chamber of $\sim 1.5\times10^{-2}$ atm-cc/sec through an injection needle, resulting in a calculated flux of 1,2 di-iodo-ethane onto a surface 700$\mu$m away from the discharge end of the needle of $\sim 3\times 10^{31\ 17}$ molecules/cm$^2$/sec. As shown in FIG. 2, the delivery tubulation and injection needle confine the 1,2 di-iodo-ethane effluent until it reaches the vacuum chamber, whereupon it expands in roughly a cosine distribution with the highest density being directed at the sample.

Figure 3:
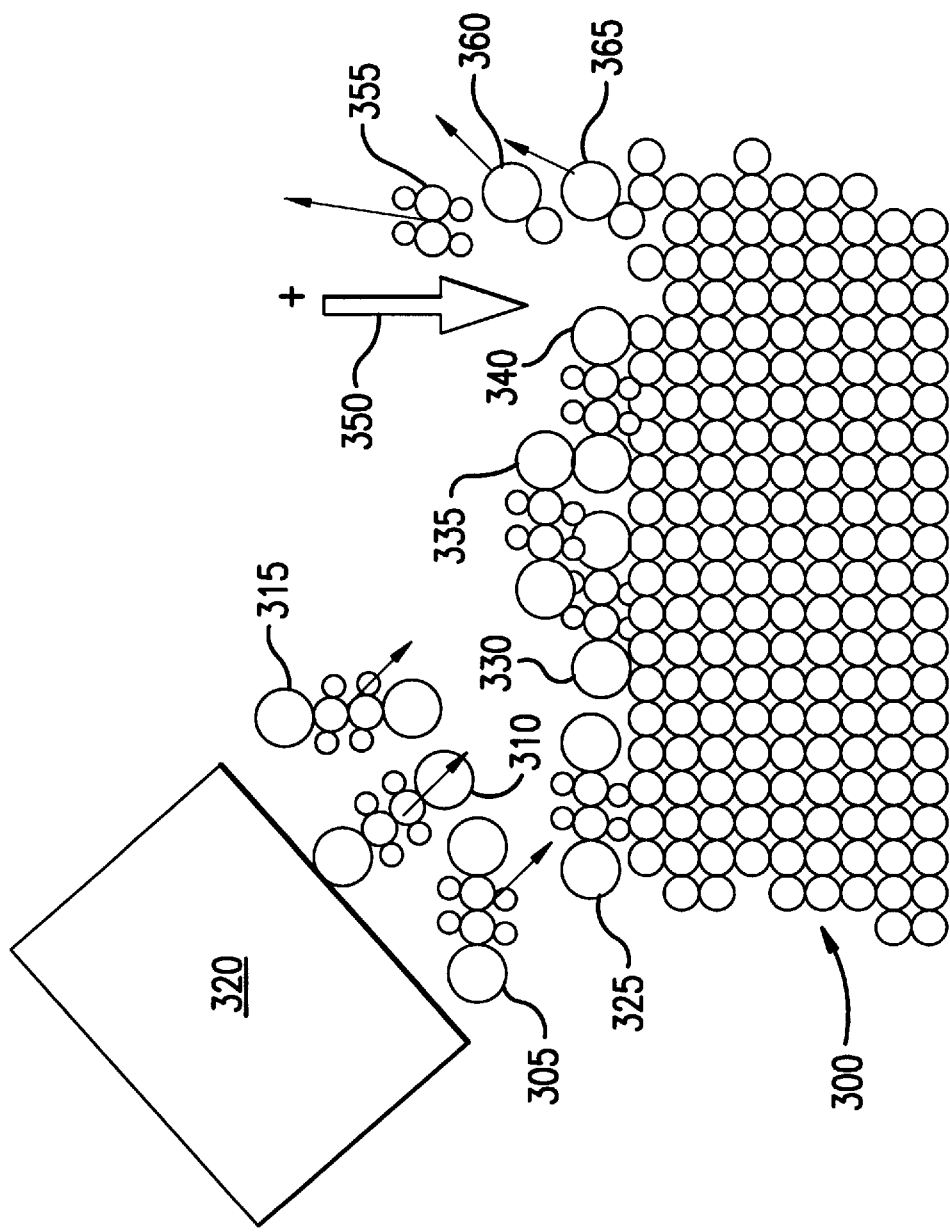
FIG. 3 shows schematically the etching process using a FIB and 1,2 di-iodo-ethane in accordance with the invention as it is believed to occur at the surface of a device.
Figure 4:
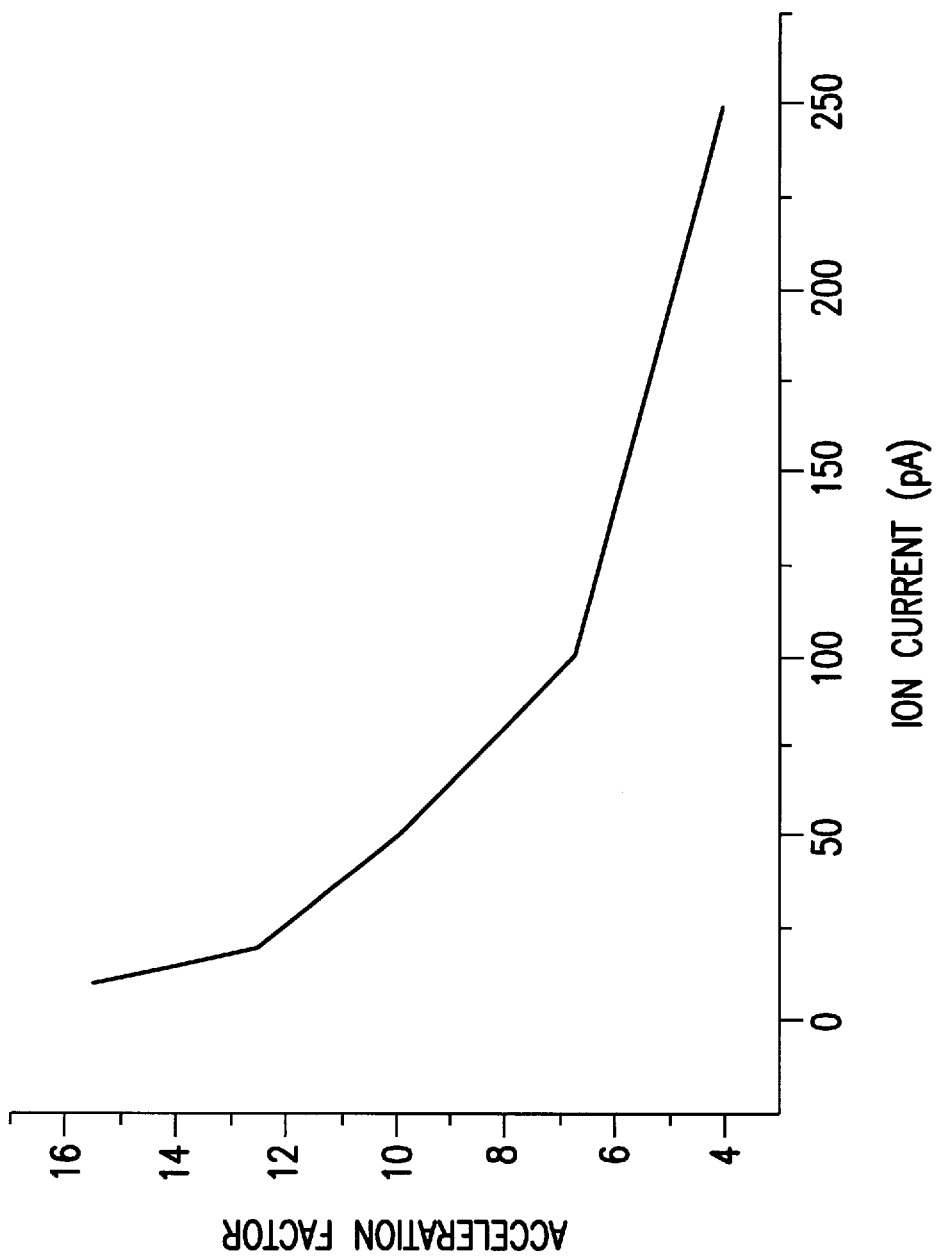
FIG. 4 shows an approximate relationship between milling acceleration and ion current when etching aluminum in accordance with the invention.

The sticking probability of 1,2 di-iodo-ethane appears to be such that it builds up a concentration on surfaces to which it is exposed. FIG. 3 illustrates the mechanism as it is believed to occur. Crystalline sample structure, such as metallic aluminum, is shown at 300. Molecules of 1,2 di-iodo-ethane are shown at 305, 310, 315 being directed from an injection needle 320. Molecules of 1,2 di-iodo-ethane 325, 330, 335, 340 are shown as building up a concentration on the upper surface of the sample. No measurable chemical reaction was found to take place on the surface from the simple exposure of 1,2 di-iodo-ethane. However, upon bombardment by ion beam 350, the 1,2 di-iodo-ethane surface layer is altered and a chemical change occurs which lowers the surface binding energy. Atoms of the crystalline metal are removed in molecules 355, 360, 365. The physics of sputtering is such that it is limited both by the kinetic energy transport within the solid or liquid sample and the binding energy of the surface atoms/molecules. The impinging ion mass or type only influences the sputtering rate insofar as it relates to energy transfer. The role the primary ions play in relation to the enhanced etching relates to activation of the 1,2 di-iodo-ethane—it is believed that free iodine atoms or ions bind to the aluminum or other sample material and lower the surface binding energy so that physical sputtering is accelerated and therefore etching rates are increased.

For aluminum, the acceleration can be at least 15×. Dielectric etching is accelerated by a factor of ~4×. Some metals, such as tungsten, do not appear to experience an acceleration of etching rate with 1,2, di-iodo-ethane. As most integrated circuit metallization is now aluminum 1,2 di-iodo-ethane is useful for rapid and preferential etching of aluminum conductors. Because all metals are not accelerated in the same way and as they have differing secondary emission coefficients, care must be taken when etching a metal trace to sever the metallization that the barrier material is removed as well as the aluminum metallization.

In general, selectivity is of most importance in the etching process. Less operator expertise is required when the process removes metal preferentially relative to dielectric. The process then has more precision and more uniformity.

1,2 di-iodo-ethane is not classified as hazardous for shipping. This simplifies handling and shipping. Because of finite shelf life, the 1,2 di-iodo-ethane compound is preferably stored in a sealed plastic storage bag, below 5° Celcius (40° Fahrenheit) in a refrigerator dedicated to chemical storage. The compound 1,2 di-iodo-ethane decomposes with time, and subsequent increased pressure requires a purge routine.

Before commencing etching, it is preferable to heat the crucible and flow the 1,2 di-iodo-ethane compound through the tubulation and the injection needle into the vacuum chamber of the FIB system for about 5 minutes. This purging is critical because the pre-purged chemical can cause formation on the sample of a compound which is difficult to mill with either the purged chemical or with the unassisted Ga+ focused-ion beam. The compound formed on the sample by the pre-purged chemical has been found to be non-uniform, which results during subsequent etching in removal of some dielectric under the aluminum while leaving some of the compound.

An example which confirms enhancement of the etch rate of aluminum using 1,2 di-iodo-ethane in a Schlumberger IDS P2X system is as follows:

1. Draw a 4 $\mu$m×4 $\mu$m "cut" box over an aluminum region of a sample IC.
2. Using a focused-ion beam current of 500 pA, mill through the aluminum, and record the milling time T1.
3. Draw a 4 $\mu$m×4 $\mu$m "metal etch" box over an aluminum region of the sample IC.
4. Using a focused-ion beam current of 100 pA, mill through the aluminum while injecting 1,2 di-iodo-ethane. Record the time T2.
5. Acceleration Factor AF is then $$AF=5\times T1/T2$$

(where the 5× multiplier compensates for the differing beam currents).

In practice, the acceleration factor has been found to be 10 or greater.

Enhanced FIB etching with 1,2 di-iodo-ethane has a number of advantages: The compound 1,2 di-iodo-ethane operates cleaner than iodine. Unlike iodine, 1,2 di-iodo-ethane does not coat the inside of delivery tubing or foul the crucible valves, and is not considered hazardous material for shipping purposes. Prior iodine contamination of the system appears to be removed by 1,2 di-iodo-ethane. The 5-minute purge sequence for 1,2 di-iodo-ethane (described above) is adequate to stabilize the process, and is of considerably shorter duration than that required for iodine.

With the Schlumberger IDS P2X system, working chamber pressure must be at most in the low $10^{-5}$ Torr range (any pressure below atmospheric—7.6×$10^2$ Torr is considered vacuum) before chemical injection operations can be initiated; if pressure is into the mid $10^{-5}$ Torr range then there is risk that the additional 1,2 di-iodo-ethane vapor pressure will shut off the ion beam because of safety interlocks in the system which protect the ion source from excessive chamber pressure. Chemical contamination of the liquid-metal ion source is a major reason for shortened ion-source life and is thus limited by the safety interlocks.

The crucible is preferably thermally well insulated and maintained at a temperature which provides a working chamber pressure of 3–5×$10^{-5}$ Torr. Other components of the vapor delivery system outlined above are also preferably thermally well insulated, including the manifold and jet assembly, and are maintained at a temperature above the crucible temperature so as to keep 1,2 di-iodo-ethane vapor from condensing out on some cold spot of the delivery system. The vapor delivery system components may be maintained, for example, at or about 60° Celcius. The elevated crucible temperature increases the vapor pressure of the 1,2 di-iodo-ethane, which flows through the delivery system, only limited by the manifold valve, and onto the sample surface in a region of interest. No reaction of 1,2 di-iodo-ethane with the metal surface of the sample has been observed in the absence of the focused ion beam. When stimulated by the focused ion beam, the 1,2 di-iodo-ethane reacts with the metal surface of the sample. The combination of the ion sputtering phenomena and decrease in surface binding energy due to the reaction of the 1,2 di-iodo-ethane with the metal results in increased etch rate over that of ion sputtering alone.

Following are some preferred operating parameters:

1. System total chamber pressure should not exceed 6.0×$10^{-5}$ Torr, to avoid damage to devices connected to the chamber, including the ion beam column.
2. System total chamber pressure should be less than 1.0×$10^{-5}$ Torr before starting a gas-assisted operation. Partial pressure of the 1,2 di-iodo-ethane gas must be over 1.0×$10^{-5}$ Torr in order to have a significant effect on operation.
3. Preferred nominal operating pressure is 4.0×$10^{-5}$ Torr which results when the 1,2 di-iodo-ethane crucible temperature is maintained at 35° Celcius, ±5° Celcius. This results in a gas flow through the needle of approximately 0.9 SCCM (standard cubic centimeters per minute) and a flow rate at the device surface, some 700 microns away from the injection needle of 800 micron diameter, of approximately 3×$10^{17}$ molecules/cm$^2$/sec.

Enhanced FIB etching with 1,2 di-iodo ethane in accordance with the invention is illustrated by examples of its use in modification of an IC:

1. Preferred Nominal Operating Conditions
   Object: To cut a 2 $\mu$m×5 $\mu$m hole through an aluminum layer. With the chamber pressure initially below 1.0×$10^{-5}$ Torr, the 1,2 di-iodo-ethane (held at 35° Celcius) is introduced to the chamber resulting in a chamber pressure of 4.0×$10^{-5}$ Torr. The ion beam current is determined by requiring a beam current density of at least 10 pA/$\mu$m$^2$, therefore a 100 pA beam is used for this case. The beam is then turned on and in approximately 30 seconds the beam will have etched through 1 $\mu$m of aluminum. The same size box with the same beam current but without introducing the 1,2 di-iodo-ethane gas to the device surface would take over 15 minutes.
2. Less Than Optimal Beam Current Density
   Object: To cut a 2 $\mu$m×5 $\mu$m hole through an aluminum layer but with a less than optimal beam current density. If in this example the beam current is chosen to be 20 pA, resulting in 2 pA/$\mu$m$^2$ beam current density, then cutting through 1 $\mu$m of aluminum will take a little over 2 minutes as opposed to 30 seconds at 10 pA/$\mu$m$^2$.
3. More Than Optimal Beam Current Density
   Object: To cut a 2 $\mu$m×5 $\mu$m hole through an aluminum layer but with a more than optimal beam current density. If in this example the beam current is chosen to be 250 pA, resulting in 25 pA/$\mu$m$^2$ beam current density, then cutting through 1 $\mu$m of aluminum will only take approximately 10 seconds. While this is faster than 30 seconds, the high milling rate makes it more difficult for the operator or the machine to stop after going through the aluminum and the higher beam current density will also start cutting through what is beneath the aluminum more quickly, resulting in a less precise operation.

4. Operating With Less Than Optimum 1,2 di-iodo-ethane Chamber Pressure.

If gas operations proceed with the chamber pressure less than $4.0 \times 10^{-5}$ Torr there will be a corresponding reduction in gas effectiveness, resulting in slower milling operations. If the 1,2 di-iodo-ethane chamber partial pressure was to fall below $1.0 \times 10^{-5}$ Torr then the operations will behave effectively as if there was no 1,2 di-iodo-ethane gas present at all.

5. Operating With More Than Optimum 1,2 di-iodo-ethane Chamber Pressure.

Operating with an excess of 1,2 di-iodo-ethane gas has not been explored due to limitations of the FIB system used in the tests. Exceeding the $6 \times 10^{-5}$ Torr chamber-pressure limit of the system is not expected to result in a faster or more precise operation, though it is possible that delivery of more 1,2 di-iodo-ethane gas to the sample surface would be beneficial in some types of operations.

6. Using 1,2 di-iodo-ethane to Etch Gold Thin-Films

FIB etching enhanced with 1,2 di-iodo-ethane gas has been tested on gold thin-films and found to result in an etch rate enhancement (compared to the etch rate without using any gas at all) of some 5 to 7 times. It performs in a similar manner to etching aluminum but with less than half the etching enhancement Acceleration Factor. This can still be a useful tool for repairing x-ray lithography masks and high-power GaAs and Si devices as well as other processes that use gold thin-films.

A FIB system suitable for carrying out the methods of the present invention is the IDS P2X system, available commercially from Schlumberger Technologies, Inc., of San Jose, Calif. In the examples, chamber pressures were monitored using the Penning gauge of the IDS P2X system. Since the gas flux and pressure at the surface of the DUT were not measured, the calibration data and chamber pressures were used as an indirect indicator.

Etching is conducted by scanning the FIB over a specified "box" (e.g. a region of 2 $\mu$m×5 $\mu$m or other specified dimension) while vapor is injected at the surface of the region through a needle. Regardless of the box dimension, 500 horizontal scan lines are used to cover the region, and one full sweep of the box is performed in 30 milliseconds (ms).

Table 1 is a summary of useful ranges and optimum/typical values for FIB etching of aluminum enhanced with injection of 1,2 di-iodo-ethane.

TABLE 1

| Parameter | Range of Values | Optimum/Typical Value |
| --- | --- | --- |
| Average Beam-Current Density | 1–60 pA/$\mu$m$^2$ | 5–10 pA/$\mu$m$^2$ |
| Background Chamber Pressure | <1.5 × 10$^{-5}$ Torr | <1.0 × 10$^{-5}$ Torr |
| Total Chamber Pressure with 1,2 di-iodo-ethane | <6 × 10$^{-5}$ Torr | 4 × 10$^{-5}$ to 5 × 10$^{-5}$ Torr |
| Crucible Temperature | 30°–38° Celcius | 32°–35° Celcius |
| Injector Temperature | ~60° Celcius | ~60° Celcius |
| Calculated Gas Flux | | |

TABLE 1-continued

| Parameter | Range of Values | Optimum/Typical Value |
| --- | --- | --- |
| Milling Rate | 0.03–0.6 $\mu$m$^3$/second | 0.3 $\mu$m$^3$/second |

Notes to Table I:
Milling over a region of 2 $\mu$m × 2 $\mu$m = 4 $\mu$m$^2$, with beam currents of 250 pA, 500 pA and 1000 pA, the acceleration factor for aluminum removal has been found to be ≈4× at a beam current density of 60 pA/$\mu$m$^2$ and to approach unity (1×) at beam current densities >60 pA/$\mu$m$^2$. The absolute rate of etching at beam current densities ≧60 pA/$\mu$m$^2$ is high, and the low acceleration factor means that the the etching process is not as selective -- aluminum and dielectric are both removed at an undesirably high rate for most semiconductor integrated circuit operations.
No enhancement of aluminum etch rate was noted at a Total Chamber Pressure with 1,2 di-iodo-ethane of less than about 1.5 × 10$^{-5}$ Torr.
In the Schlumberger IDS P2X system, the practical upper limit of Total Chamber Pressure with 1,2 di-iodo-ethane is ≈6 × 10$^{-5}$ Torr because, above that value, the 1,2 di-iodo-ethane vapor migrates into the FIB column and hampers FIB column operation or triggers safety interlocks which shut down the FIB column.
Indicated Crucible Temperature values may vary from machine to machine. The Crucible Temperature setting is established to attain the desired chamber pressure. Experience has shown that the indicated Total Chamber Pressure values are attained with Crucible Temperature settings in the indicated ranges.

FIG. 5 shows an approximate relationship between milling acceleration and ion current when etching aluminum in accordance with the invention. The ion current is given for a nominal FIB working area size of about 4 $\mu$m$^2$.

Those of skill in the art will recognize that these and other modifications can be made within the spirit and scope of the invention as defined in the claims which follow.

We claim:

1. A method of etching material from a specimen, comprising:

a. placing a specimen in a vacuum chamber;

b. directing a vapor containing molecules of 1,2 di-iodo-ethane at a localized surface region of the specimen from which material is to be etched;

c. generating a focused ion beam; and d. directing the focused ion beam at the localized surface region to etch material from the specimen.

2. The method of claim 1, wherein the specimen comprises an integrated circuit.

3. The method of claim 1, wherein the material to be etched comprises aluminum.

4. The method of claim 1, wherein the material to be etched comprises gold.

5. The method of claim 1, wherein the focused ion beam is scanned over the localized surface region at an average beam-current density of about 1 pA/$\mu$m$^2$ to about 60 pA/$\mu$m$^2$.

6. The method of claim 1, wherein the focused ion beam is scanned over the localized surface region at an average beam-current density of about 5 pA/$\mu$m$^2$ to about 10 pA/$\mu$m$^2$.

7. The method of claim 1, wherein the vacuum chamber has a background chamber pressure prior to introduction of 1,2 di-iodo-ethane of less than about 1.5×10$^{-5}$ Torr.

8. The method of claim 1, wherein the vacuum chamber has a background chamber pressure prior to introduction of 1,2 di-iodo-ethane of less than about 1.0×10$^{-5}$ Torr.

9. The method of claim 1, wherein the vacuum chamber has a total chamber pressure during introduction of 1,2 di-iodo-ethane of less than about 6×10$^{-5}$ Torr.

10. The method of claim 1, wherein the vacuum chamber has a total chamber pressure during introduction of 1,2 di-iodo-ethane of between about 4×10$^{-5}$ Torr and about 5×10$^{-5}$ Torr.

11. The method of claim 1, wherein directing a vapor containing molecules of 1,2 di-iodo-ethane at a localized surface region of the specimen from which material is to be etched comprises maintaining a quantity of 1,2 di-iodo-ethane in a container at a temperature of about 30° –38° Celcius, and allowing vapor of 1,2, di-iodo-ethane to pass along a pathway from the container through an injection orifice toward the localized surface region.

12. The method of claim 11, wherein the pathway is maintained at a temperature of about 60° Celcius.

13. The method of claim 1, wherein directing a vapor containing molecules of 1,2 di-iodo-ethane at a localized surface region of the specimen from which material is to be etched comprises maintaining a quantity of 1,2 di-iodo-ethane in a container at a temperature of about 32° –35° Celcius, and allowing vapor of 1,2, di-iodo-ethane to pass along a pathway from the container through an injection orifice toward the localized surface region.

14. The method of claim 13, wherein the pathway is maintained at a temperature of about 60° Celcius.

15. The method of claim 1, wherein the ions have an energy in the range of 5 kev to 40 kev.

16. The method of claim 1, wherein focused ion beam is generated from a liquid metal ion source of Gallium ions.

* * * * *

UNITED STATES PATENT AND TRADEMARK OFFICE
CERTIFICATE OF CORRECTION

PATENT NO. : 5,840,630
DATED : November 24, 1998
INVENTOR(S) : Cecere, et. al.

It is certified that error appears in the above-identified patent and that said Letters Patent is hereby corrected as shown below:

Title page, item [54] and col. 1, line 1, delete "FBI" and insert --FIB--

Signed and Sealed this

Ninth Day of March, 1999

Attest:

Attesting Officer

Q. TODD DICKINSON

Acting Commissioner of Patents and Trademarks